(12) United States Patent
Hwu et al.

(10) Patent No.: US 8,338,923 B1
(45) Date of Patent: Dec. 25, 2012

(54) PACKAGE STRUCTURE OF MULTI-LAYER ARRAY TYPE LED DEVICE

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 0 days.

(21) Appl. No.: 13/224,330

(22) Filed: Sep. 2, 2011

(51) Int. Cl.
*H01L 23/495* (2006.01)
(52) U.S. Cl. .................. 257/666; 257/E33.066
(58) Field of Classification Search .......... 257/233, 257/288, 292, 666, 676, E33.066, E23.042
See application file for complete search history.

(56) References Cited

U.S. PATENT DOCUMENTS 5,650,645 A * 7/1997 Sone et al. ............. 257/288
2007/0063338 A1 * 3/2007 Chang et al. ........... 257/714
2008/0258130 A1 * 10/2008 Bergmann et al. ........ 257/13
2012/0133268 A1 * 5/2012 Hwu et al. .............. 313/489

FOREIGN PATENT DOCUMENTS
TW M393044 11/2010
* cited by examiner

*Primary Examiner* — Thao P. Le
(74) *Attorney, Agent, or Firm* — Lin & Associates IP, Inc.

(57) ABSTRACT

A package structure of multi-layer array type LED device is disclosed, wherein a peripheral area of a substrate and a surface of lead frame are respectively installed with a convex/concave surface structure. The convex/concave surface structure increases the surface roughness of the peripheral area of the substrate and the surface of the lead frame, so a liquid package material can be filled in cavities and concave parts; thus a package member formed through the package material being solidified can be firmly combined with the substrate and the lead frame as one piece. In addition, the bottom of a lens is provided with a binder for increasing the sealing level of the lens. Moreover, the present invention adopted a soldering paste added with material having good heat conductivity, so heat generated by LED dices can be rapidly dissipated to the exterior.

40 Claims, 14 Drawing Sheets

PACKAGE STRUCTURE OF MULTI-LAYER ARRAY TYPE LED DEVICE

BACKGROUND OF THE INVENTION

1. Field of the Invention

The present invention relates to a package structure of LED device, and more particular to a package structure of high-strength and airtight multi-layer array type LED device capable of completely blocking vapor and moisture, being durable in use, and maintaining the performance of optical component in long term.

2. The Prior Arts

The light-emitting theory of LED takes advantage of the intrinsic properties of semiconductors, which is different from the theory of electric discharging, heat and light-emitting of an incandescent light tube. Because light is emitted when electric current forward flowed across the PN junction of a semiconductor, the LED is also called cold light. The LED has the features of high durability, long service life, light-weight, low power consumption, and being free of toxic substances like mercury, and thereby it can be widely used in the industry of luminance equipment, and LEDs are often arranged in an array and often used in such as electric bulletin board or traffic sign.

Please refer to Taiwanese Patent No. M393044 titled in "Optical lens with fluorescent layer applicable in a LED packaging structure". Please refer to FIG. 1, which is a cross section view showing an optical lens with a fluorescent layer applied in a LED packaging structure. The optical lens with a fluorescent layer applied in a LED packaging structure includes a substrate 1a, a package member 2a, lead frames 3a, an optical lens 4a, and a lens cover 5a. The substrate 1a is disposed at the bottommost layer of the package structure, wherein each surface of the substrate 1a is a flat and smooth surface, and the periphery of the substrate 1a is covered and fastened by the package member 2a. The inner wall surface of the package member 2a is installed with a light reflector 6a, and the package member 2a also covers and fastens the lead frames 3a, wherein each surface of the lead frames 3a is also a flat and smooth surface.

The light reflector 6a is installed with the optical lens 4a and the lens cover 5a, wherein the lens cover 5a covers the optical lens 4a, and the lens cover 5a is fastened on top of the light reflector 6a with an adhesion means, such that the lens cover 5a is mounted in the package member 2a, thereby firmly fastening the lens cover 5a in the package member 2a and on the light reflector 6a.

However, one disadvantage of conventional arts is that each surface of the substrate is flat and smooth. When the substrate is packaged and fastened by the package member, a plane-to-plane contact relation is formed. The plane-to-plane contact provides very little friction between the package member and the substrate, so occurrences of unstable sliding may take place. The mentioned unstable sliding may also take place on the lead frame. Moreover, the package member often utilizes a liquid material for covering the periphery of the substrate or other components to be covered. When the liquid material is solidified for packaging the substrate, the liquid material is hard to be evenly distributed on each surface of the substrate duo to the over smoothness of each surface. One solution adopted is to provide additional amount of material or to manually process the package, thereby consuming unnecessary costs.

Another disadvantage of conventional arts is that the lens cover may not be fastened on the light reflector in a long term. Because the material of the lens cover is plastic, and the light reflector often adopted a metal material for coating a metal layer on the surface so as to increase the reflectivity of the light reflector. It is known that plastic is hard to be adhered and fastened on the surface of a metal, so the plastic-made lens cover may gradually loosen from the metal-made light reflector.

When a loosening situation happens between the substrate and the package member, and when the lens cover is not able to be firmly fastened on the optical lens, moisture or vapor may permeate into the interior of the package structure, thereby deteriorating or even damaging the light emitting component and optical component. As a result, the conventional arts can not be used in a humid environment. Thus, an improved package structure of LED capable of completely blocking vapor and moisture, durable in use, and maintaining the performance of optical component in long term shall be provided.

SUMMARY OF THE INVENTION

A primary objective of the present invention is to provide a package structure of multi-layer array type LED device, wherein each surface at the periphery of a substrate is formed with a surface structure. The surface structure is configured to a state where convex parts and concave parts being staggeringly arranged. The concave parts allow a package material, which is in a liquid state, to flow and fill in the concave parts of the surface structure. When the package material is solidified, the portion of the package material filled in the concave parts and the portion of the package material corresponding to the convex parts form a latch relation with the substrate, thereby firmly combing the substrate and a package member, formed through the package material being solidified, as one piece and greatly enhancing the structural strength and package sealing of the substrate and the package member.

Another objective of the present invention is to provide a package structure of multi-layer array type LED device, wherein a lead frame embedded in a package member has plural second cavities allowing a liquid package material to be filled, thereby preventing the liquid package material from flowing out from the lead frame. When the package material is solidified, the portion of the package material filled in the second cavities forms a latch relation with the lead frame, thereby firmly combing the lead frame and a package member, formed through the package material being solidified, as one piece and greatly enhancing the engaging and combing level of the lead frame and the package member.

One another objective of the present invention is to provide a package structure of multi-layer array type LED device, wherein the bottom of a lens disposed at the topmost layer of the package structure is further provided with a binder for allowing the lens to be more firmly adhered with components disposed below, thereby preventing external moisture from permeating into the lens and the interior of the package structure. In addition, instead of being disposed on a light reflector, the lens is installed on a silica insulation layer having the similar material with respect to the lens, thereby preventing the lens from loosening and increasing the package sealing of the lens in the package structure.

Still one another objective of the present invention is to provide a package structure of multi-layer array type LED device, which is capable of increasing the heat dissipation speed of LED dices, wherein a soldering paste provided with diamond powders is utilized to solder the LED dices on a substrate. Because the diamond powder has a better heat conductivity, heat generated by the LED dices can be effectively conducted to the exterior. Moreover, the diamond powder can be coated with material having good heat conductivity, so heat generated by the LED dices can be more rapidly dissipated to external space.

BRIEF DESCRIPTION OF THE DRAWINGS

The present invention will be apparent to those skilled in the art by reading the following detailed description of a preferred embodiment thereof, with reference to the attached drawings, in which:

FIG. 3b is a partially enlarged view showing an area IIIB of FIG. 3a;

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 2:
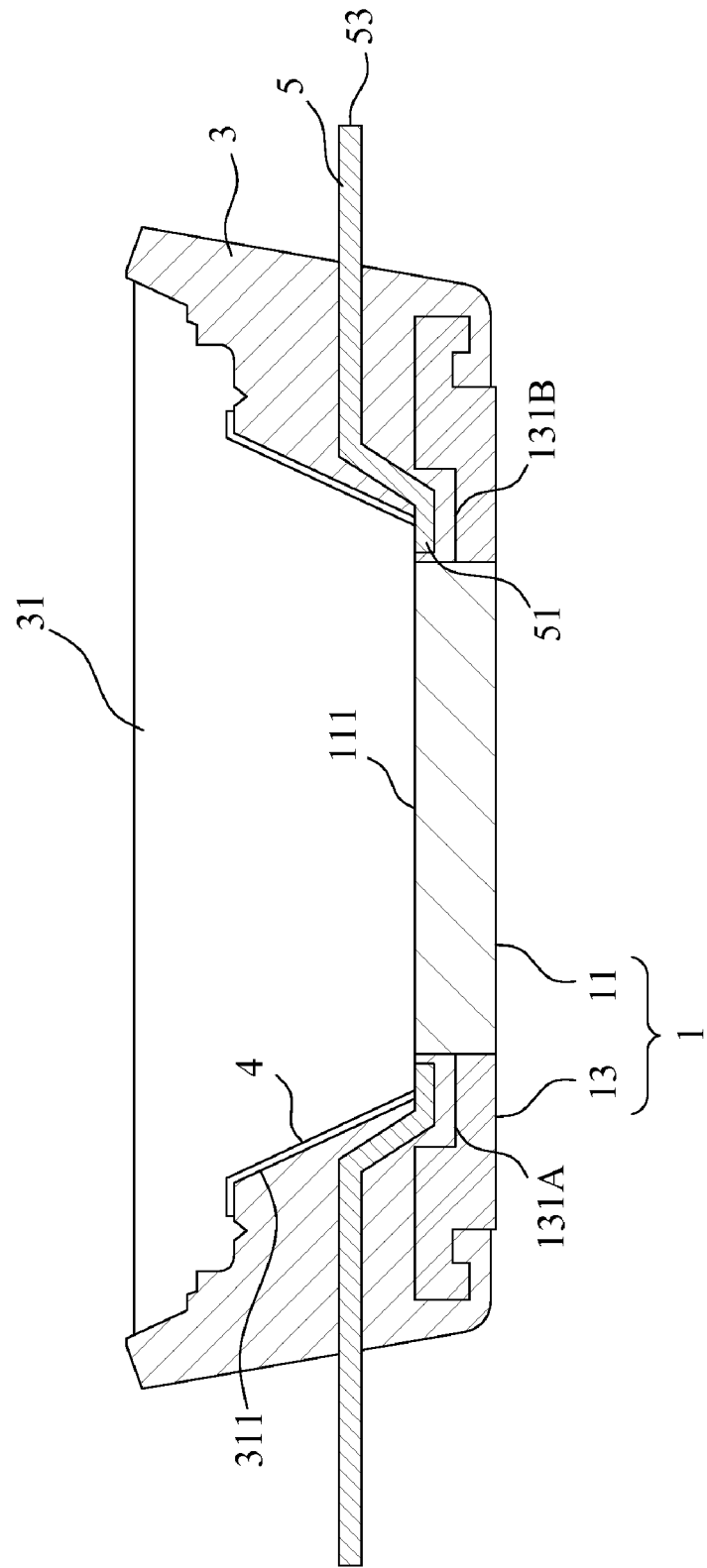
FIG. 2 is a schematic view showing the package structure of multi-layer array type LED device according to a first embodiment of the present invention.

Please refer to FIG. 2, which is a schematic view showing the package structure of multi-layer array type LED device according to the first embodiment of the present invention. The present invention relates to a package structure of multi-layer array type LED device, which is capable of completely preventing external moisture from entering the interior of the package structure of multi-layer array type LED device, thereby avoiding deteriorations of each internal optical component due to moisture.

According to present invention, the package structure of multi-layer array type LED device at least includes a substrate 1, a package member 3 and two lead frame pairs 5. The substrate 1 can be divided into a central area 11 and a peripheral area 13. The top surface of the central area 11 is defined as a light output surface 111 which covers the central portion of the substrate 1. Preferably, the area covered by the central area 11 is larger than the area covered by the peripheral area 13. The peripheral area 13 is an area defined between the central area 11 and the edge of the substrate 1, and the peripheral area 13 has a top surface 131, a lateral surface 133 and a bottom surface 135.

Figure 3A:
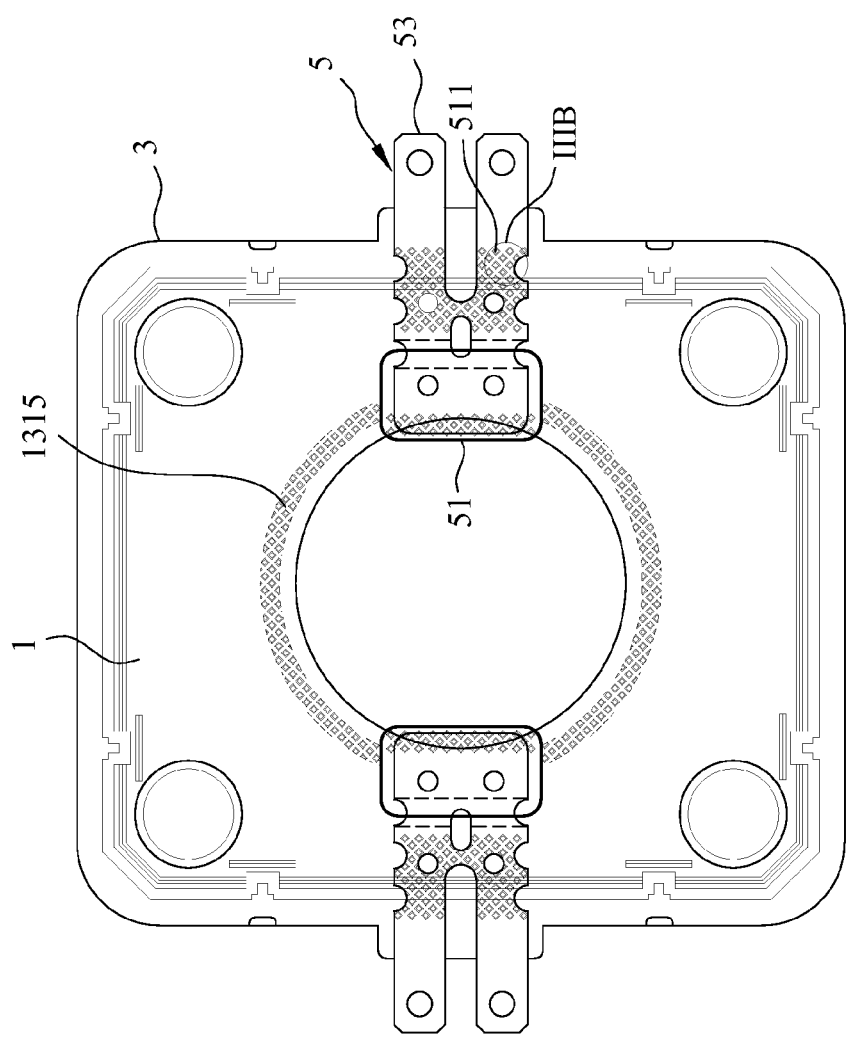
FIG. 3a is a top view showing the package structure of multi-layer array type LED device according to the present invention.
Figure 3B:
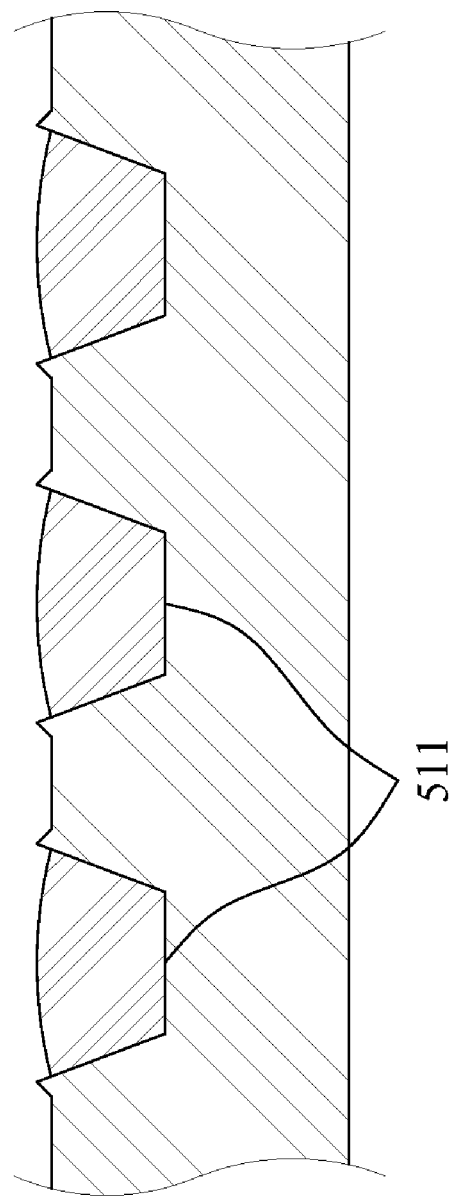

Please refer to FIG. 3a, which is a top view showing the package structure of multi-layer array type LED device according to the present invention. Please also refer to FIG. 1 and FIG. 3b, wherein FIG. 3b is a partially enlarged view showing an area 111B of FIG. 3a. The top surface 131 is formed with two accommodating slots 131A, 131B and plural first concavities 1315, and the two accommodating slots 131A, 131B are preferably formed at corresponding locations on the top surface 131. In addition, the two accommodating slots 131A, 131B are preferably installed close to the location of the light output surface 111, i.e. the two accommodating slots 131A, 131B are disposed close to two sides of the light output surface 111. The first cavities 1315 can be annularly arranged, and can be installed in the two accommodating slots 131A, 131B. The shape of the central area 11 can be round, oval, rectangular, polygonal, or other suitable shapes.

The package member 3 covers the peripheral area 13 of the substrate 1 but the central area 11 is not covered. The area covered by the package member 3 includes the top surface 131, the lateral surface 133 and the bottom surface 135. The package member 3 has a package chamber 31 which is the portion of the package member 3 not covering the central area 11, so the package member 3 defines an accommodating space above the central area 11. The accommodating space allows optical components to be installed in the package chamber 31, and the bottom of the package chamber 31 is the light output surface 111.

An included angle relation is formed between an inner wall surface 311 of the package chamber 31 and the light output surface 111, wherein the included angle is preferably smaller than 90 degree. When the included angle between the inner wall surface 311 and the light output surface 111 is smaller than 90 degree, the inner wall surface 311 is enabled to face the outside of the package chamber 31, so when light is projected on the inner wall surface 311, the light can be facilitated to be reflected to the outside of the package chamber 31. In addition, the inner wall surface 311 can be further installed with a light reflector 4. With the installation of the light reflector 4, the probability of the light being reflected out of the package chamber 31 can be greatly increased, thereby raising the lighting illuminance.

The package member 3 utilizes a package material to cover the peripheral area 13 of the substrate 1, wherein the package material can be mold resin, and the material of mold resin can be poly-phthal-amide (PPA) or liquid crystal polymer (LCP).

Figure 1:
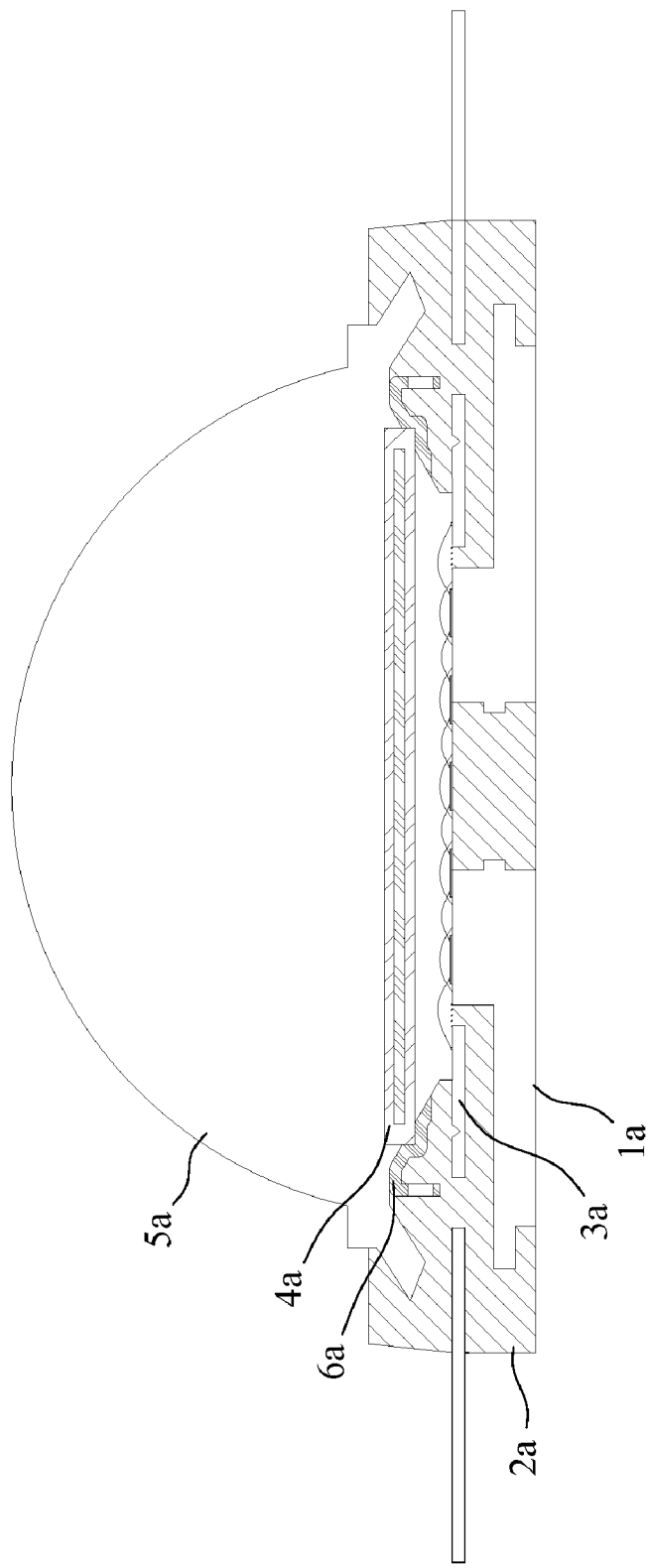
FIG. 1 is a cross section view showing an optical lens with a fluorescent layer applied in a LED packaging structure.

Please refer to FIGS. 3a, 3b and 2, the two lead frames 5 both have an inner end part 51 and an outer end part 53. The inner end parts 51 of the two lead frames 5 are respectively disposed in the two accommodating slots 131A, 131B, wherein the horizontal altitude of the outer end part 53 can be higher than that of the inner end part 51. As shown in FIG. 1, a portion of each lead frame 5 can be formed with a bended portion, the inner end part 51 and the outer end part 53 of each lead frame 5 are defined through extending two ends of the bended portion.

The package member 3 is disposed between the two lead frames 5 and the substrate 1, and the portion of each lead frame 5 defined between the inner end part 51 and the outer end part 53 is embedded in the package member 3 while the inner end part 51 and the outer end part 53 are exposed out of the package member 3, wherein one surface of each lead frame 5 is formed with plural second cavities 511 which are preferably arranged at the peripheries of the inner end parts 51 and the outer end parts 53 of the two lead frames 5.

The installations of the first cavities 1315 and the second cavities 511 are for respectively enhancing the adherence of the package member 3 to the substrate 1 and the lead frames 5. The lead frame 5 is made of an electrically-conductive metal while the package member 3 is made of a plastic or resin material which is not easy to be adhered with metal. With the second cavities 511 formed on the lead frame 5, the surface roughness of the lead frame 5 can be increased, and the second cavities 511 can be filled with liquid plastic or resin for allowing the liquid plastic or resin to be distributed on the surface of the lead frame 5. As such, when the liquid plastic or resin is solidified, the adherence of the package member 3 to the lead frame 5 can be enhanced, thereby firmly sealing the package member 3 and the lead frame 5.

Figure 4:
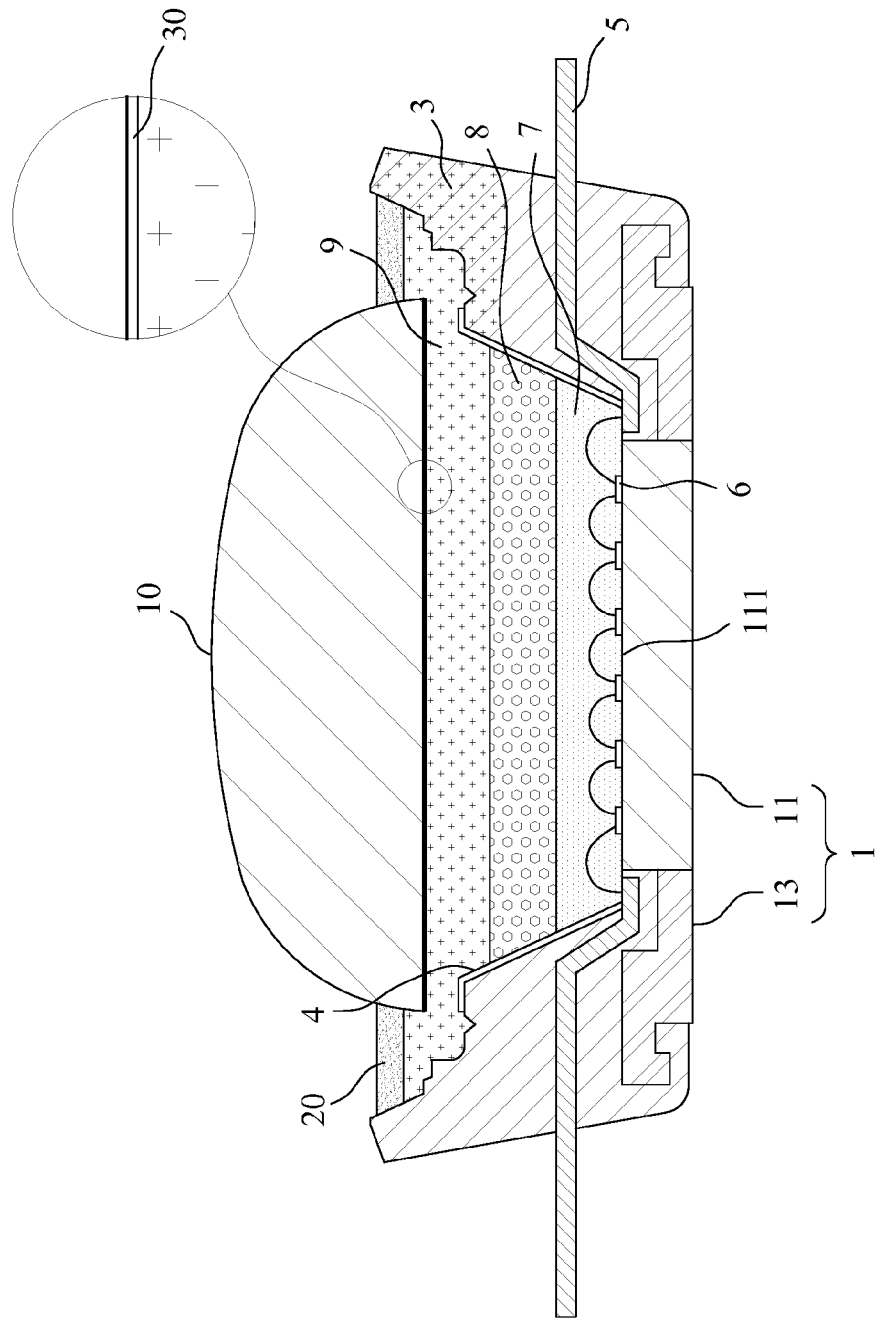
FIG. 4 is a schematic view showing the package structure of multi-layer array type LED device according to a second embodiment of the present invention.

Please refer to FIG. 4, which is a schematic view showing the package structure of multi-layer array type LED device according to the second embodiment of the present invention. The light output surface 111 is installed with a plurality of LED dices 6 which can be arranged on the light output surface 111 with an array format. The LED dices 6 are electrically connected to the two lead frames 5, wherein the electrical connection between the LED dices 6 and the two lead frames 5 is formed through a wire bonding means.

The LED dices 6 are soldered on the light output surface 111 of the substrate 1 through a soldering paste (not shown), wherein the soldering paste can be at least one of tin paste or silver adhesive, wherein the tin paste can be further mixed with carbon crystals or diamond crystals. The diamond crystals can be coated with nickel, silver or other material with good heat conductivity. Through the soldering paste being added with the material having good heat conductivity, the heat conductive performance of the soldering paste can be greatly enhanced, such that heat generated by the LED dices 6 can be rapidly transmitted to external space through the substrate 1.

A dice protection layer 7 can be further formed on the LED dices 6. The dice protection layer 7 is provided for covering the LED dices 6, so the LED dices 6 are protected from external moisture and external pollution, wherein the material of the dice protection layer 7 is silica. A fluorescent gel layer 8 can be further formed on of the dice protection layer 7. The fluorescent gel layer 8 is provided for mixing colors of the lights emitted by the LED dices 6.

A silica insulation layer 9 can be further formed on the fluorescent gel layer 8. The silica insulation layer 9 is provided for insulating external moisture from entering the fluorescent gel layer 8, thereby preventing the fluorescent gel layer 8 from being deteriorated due to moisture. In addition, a lens 10 can be installed on the silica insulation layer 9, and the lens 10 is adhered on the silica insulation layer 9 through an underfilling layer 20, wherein the lens 10 is spacedly disposed on the silica insulation layer 9 with respect to the light reflector 4 for avoiding direction contact. The silica insulation layer 9 and the lens 10 are both made of plastic materials, so the lens 10 can be firmly fastened and sealed on the silica insulation layer 9. Moreover, the lens 10 is also fastened by the underfilling layer 20 thereby more effectively preventing the lens 10 from loosening. Wherein the material of the underfilling layer 20 can be epoxy or other suitable materials.

In addition, a primer 30 can be provided between the silica insulation layer 9 and the lens 10 for increasing the sealing between the silica insulation layer 9 and the lens 10, thereby preventing external moisture from permeating into the lens 10 and the fluorescent gel layer 8 below the silica insulation layer 9.

Figure 5:
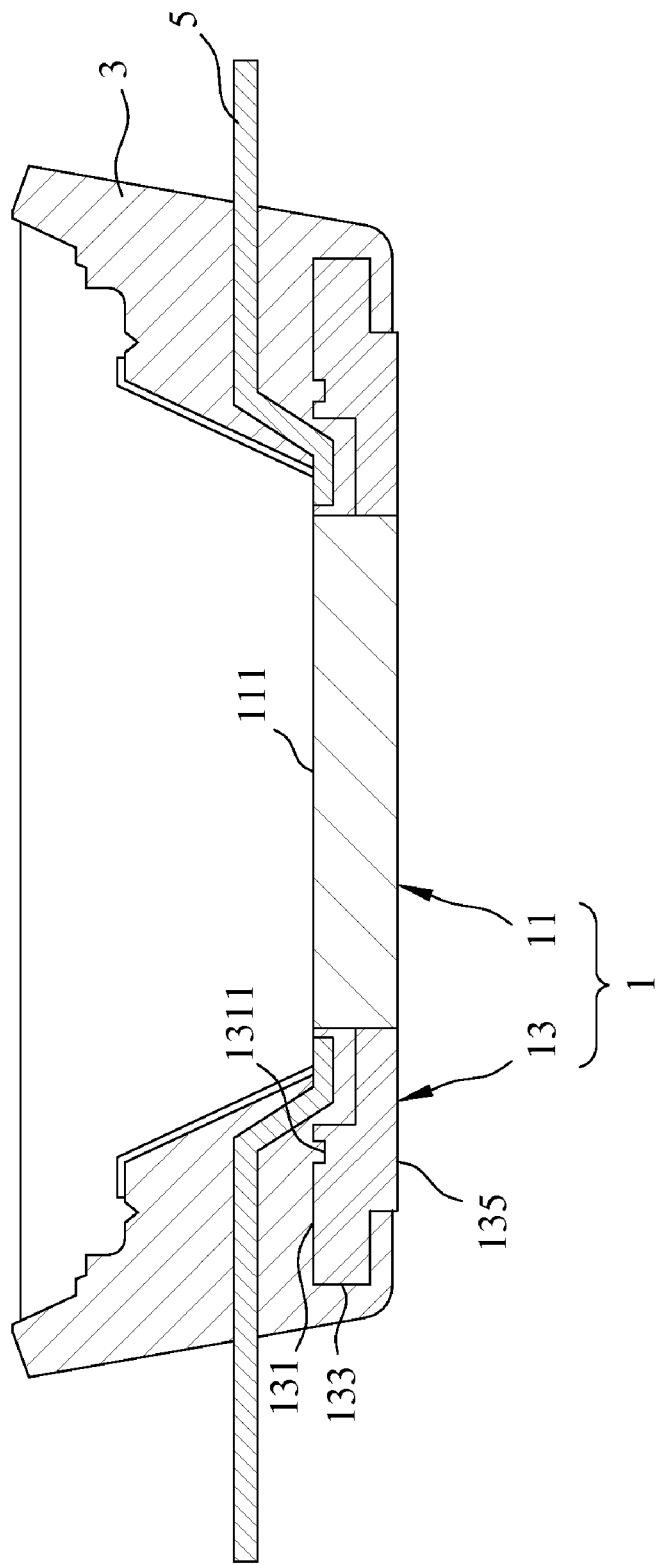
FIG. 5 is a schematic view showing the substrate according to a first embodiment of the present invention.
Figure 6:
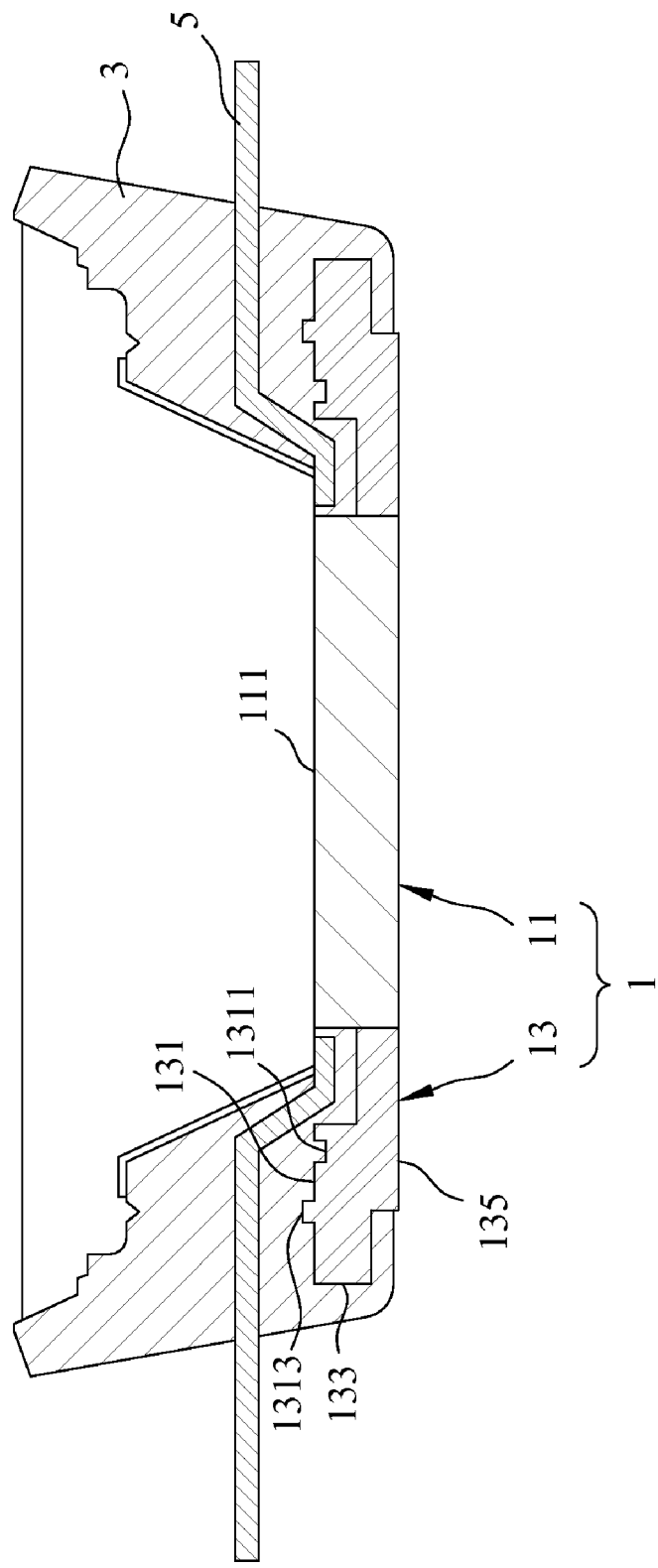
FIG. 6 is a schematic view showing the substrate according to a second embodiment of the present invention.

Please refer to FIG. 5, which is a schematic view showing the substrate according to the first embodiment of the present invention. Please refer to FIG. 6, which is a schematic view showing the substrate according to the second embodiment of the present invention. The top surface 131 of the substrate 1 can be formed with a first top groove 1311, as shown in FIG. 5. Or as shown in FIG. 6, the top surface 131 can be further formed with a top protrusion part 1313, wherein the top surface 131 can be formed with either the first top groove 1311 or the top protrusion part 1313, or the top surface 131 can be formed with both of the first top groove 1311 and the top protrusion part 1313.

The shape of the first top groove 1311 can be U-shaped, concave, V-shaped, or other suitable shapes. What shall be addressed is that the quantity of the mentioned first top groove 1311 and the top protrusion part 1313 is determined with respect to the actual needs. The quantity disclosed in this embodiment is illustrated by way of example and not by way of limitation and the scope of the invention is defined by the appended claims which should be construed as broadly as the prior art will permit.

Figure 7:
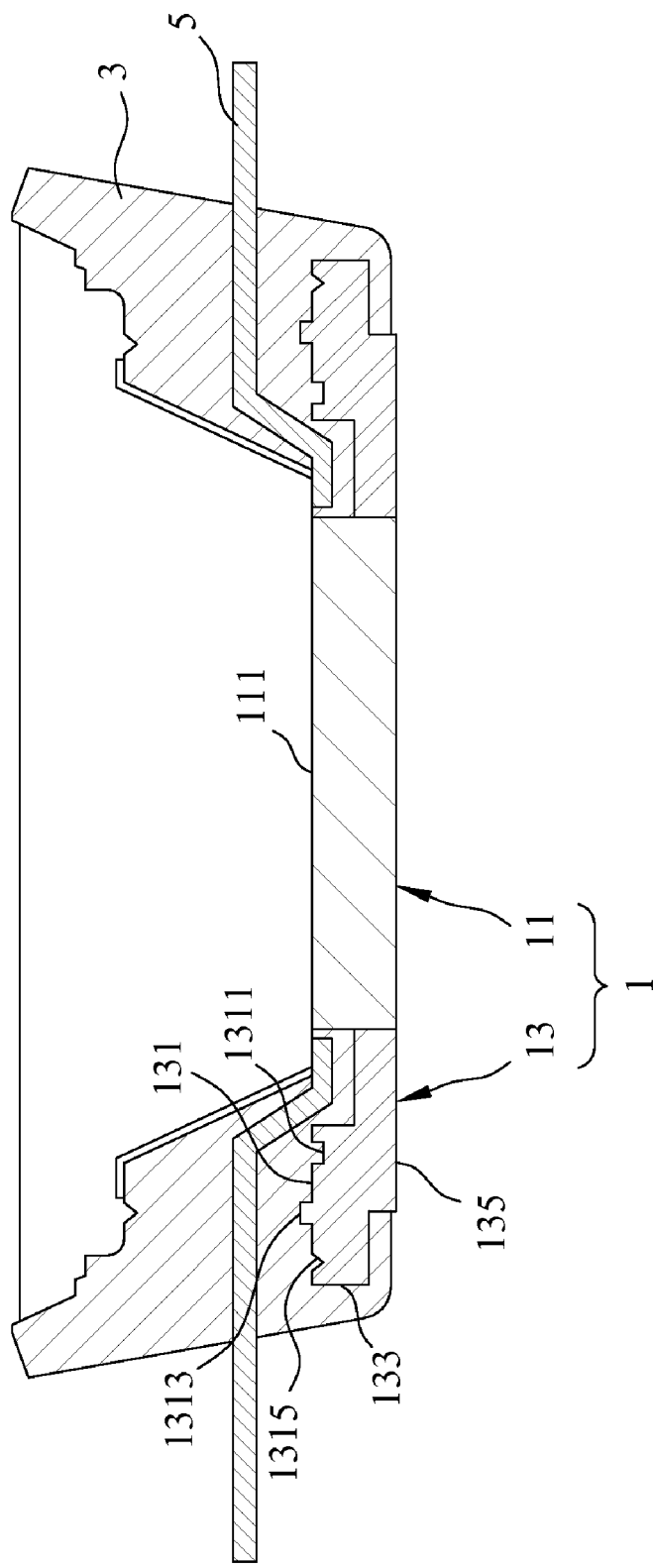
FIG. 7 is a schematic view showing the substrate according to a third embodiment of the present invention.

Please refer to FIG. 7, which is a schematic view showing the substrate according to the third embodiment of the present invention. The top surface 111 can be further formed with a second top groove 1315 which is installed between the top protrusion part 1313 and the edge of the substrate 1. The shape of the second top groove 1315 can be U-shaped, concave, V-shaped, or other suitable shapes.

Figure 8:
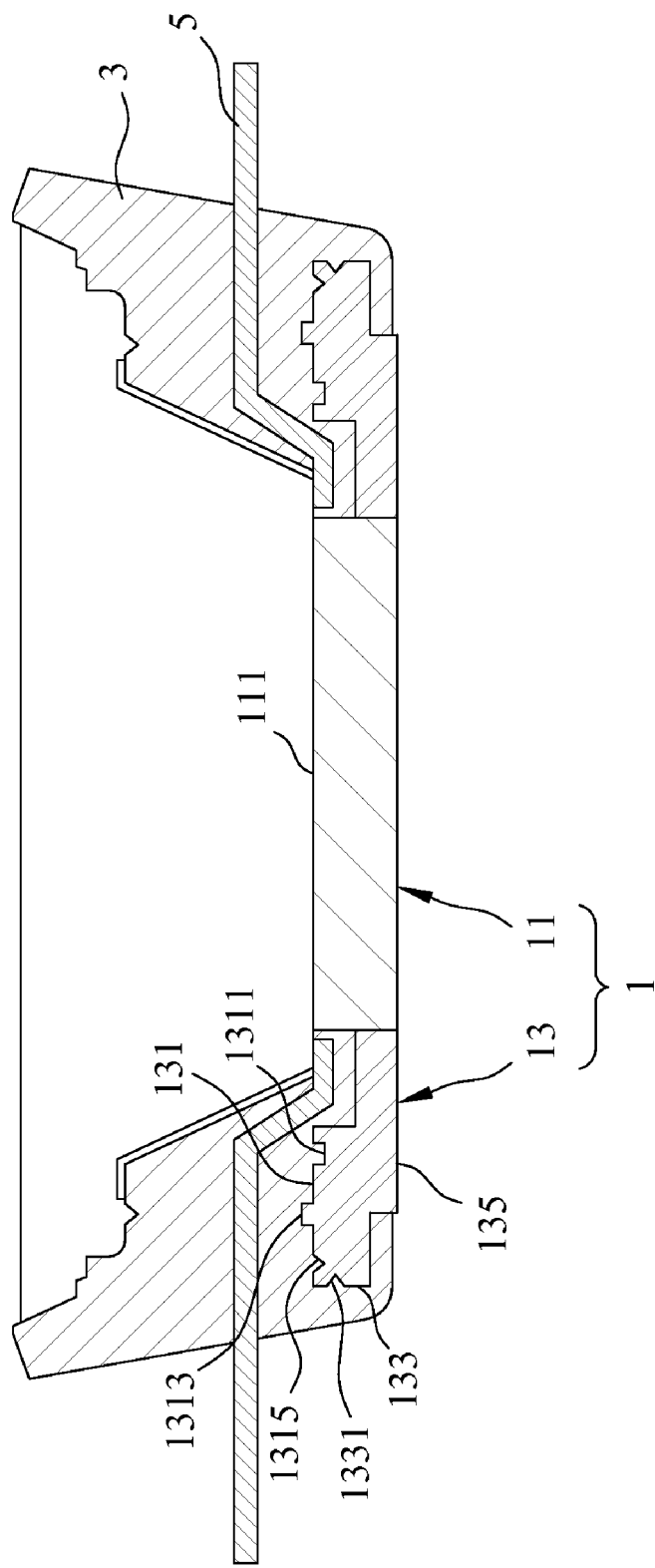
FIG. 8 is a schematic view showing the substrate according to a fourth embodiment of the present invention.
Figure 9:
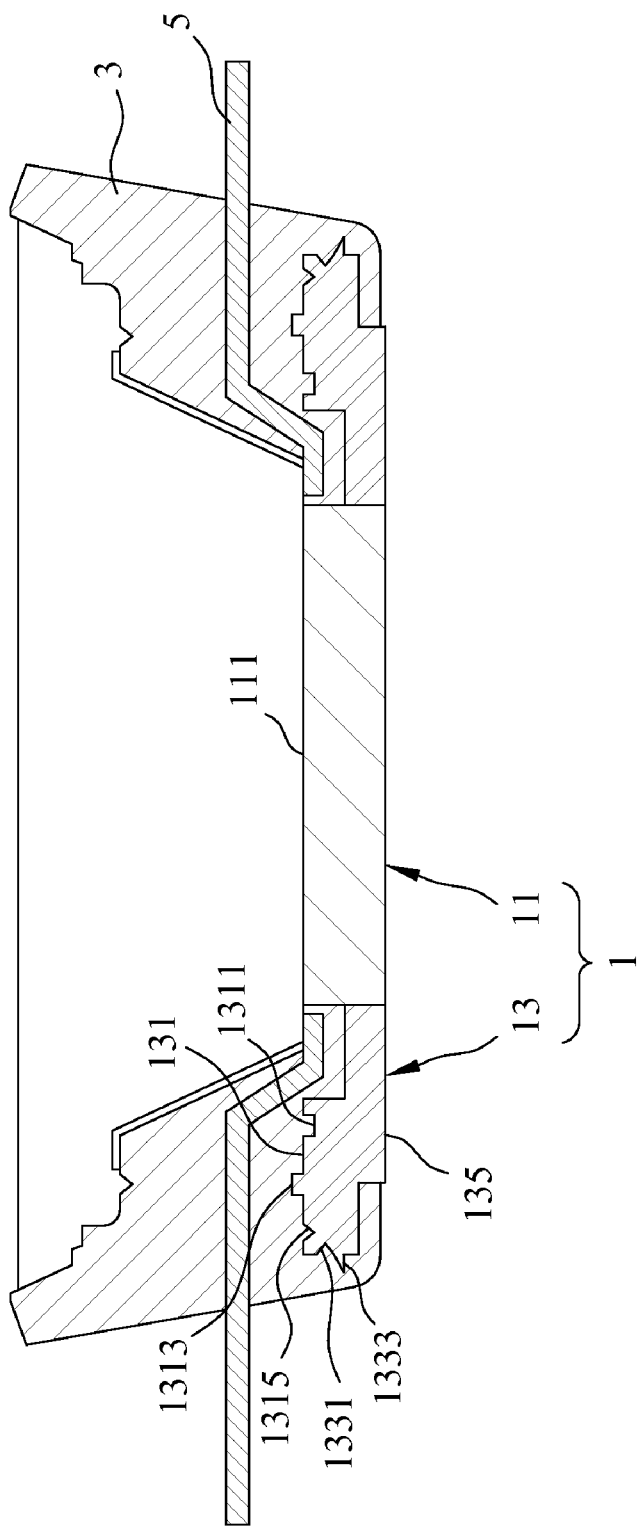
FIG. 9 is a schematic view showing the substrate according to a fifth embodiment of the present invention.

Please refer to FIG. 8, which is a schematic view showing the substrate according to the fourth embodiment of the present invention. Please refer to FIG. 9, which is a schematic view showing the substrate according to the fifth embodiment of the present invention. As shown in FIG. 8, the lateral surface 133 can be formed with a lateral groove 1331. Or as shown in FIG. 9, the lateral surface 133 can be formed with a lateral protrusion part 1333, and an L-shaped structure is defined by the lateral protrusion part 1333 and the portion of the lateral surface 133 below the lateral protrusion part 1333. Wherein the lateral surface 133 can be either formed with the lateral groove 1331 or the lateral protrusion part 1333, or the lateral surface 133 can be formed with both of the lateral groove 1331 and the lateral protrusion part 1333. The shape of the lateral groove 1331 can be U-shaped, concave, V-shaped, or other suitable shapes.

Figure 10:
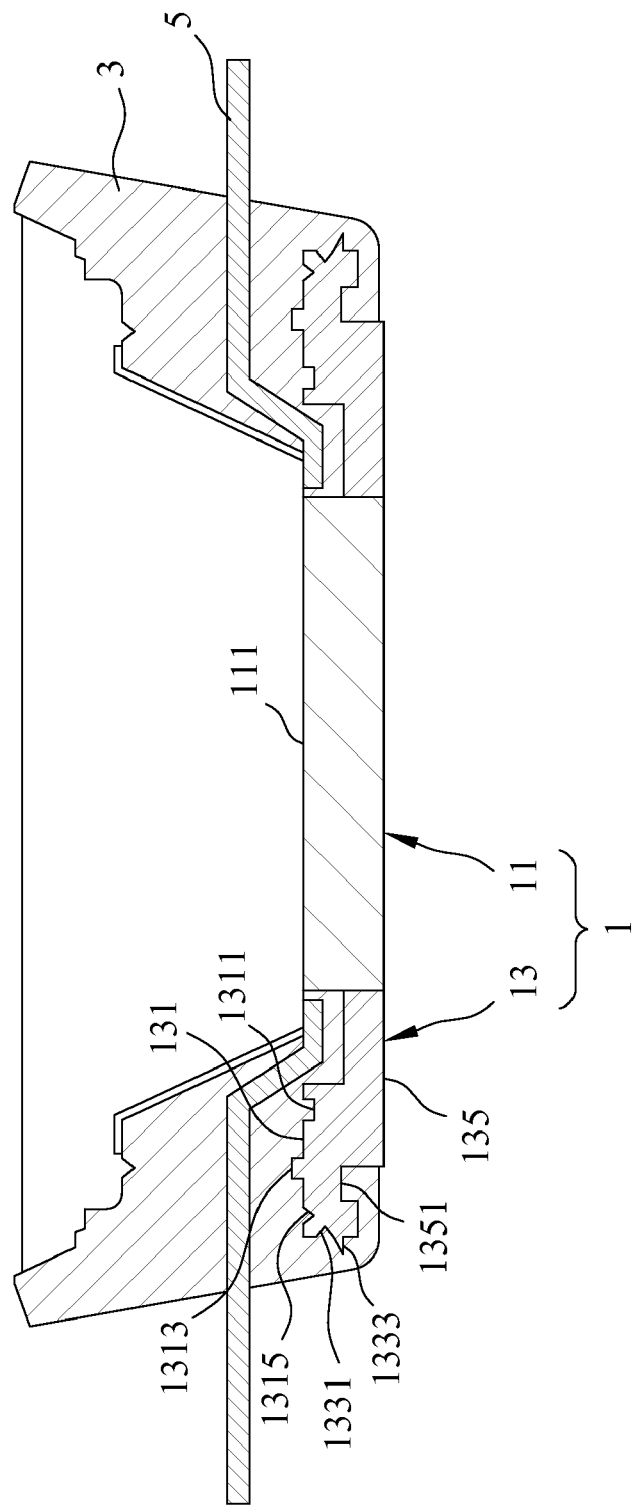
FIG. 10 is a schematic view showing the substrate according to a sixth embodiment of the present invention.

Please refer to FIG. 10, which is a schematic view showing the substrate according to the sixth embodiment of the present invention. The bottom surface 135 can be formed with a bottom groove 1351. As shown in FIG. 10, the bottom surface 135 can also be formed with a bottom protrusion part (not shown), wherein the bottom surface 135 can be formed with either the bottom groove 1351 or the bottom protrusion part, or the bottom surface 135 can be formed with both of the bottom groove 1351 and the bottom protrusion part.

Figure 11:
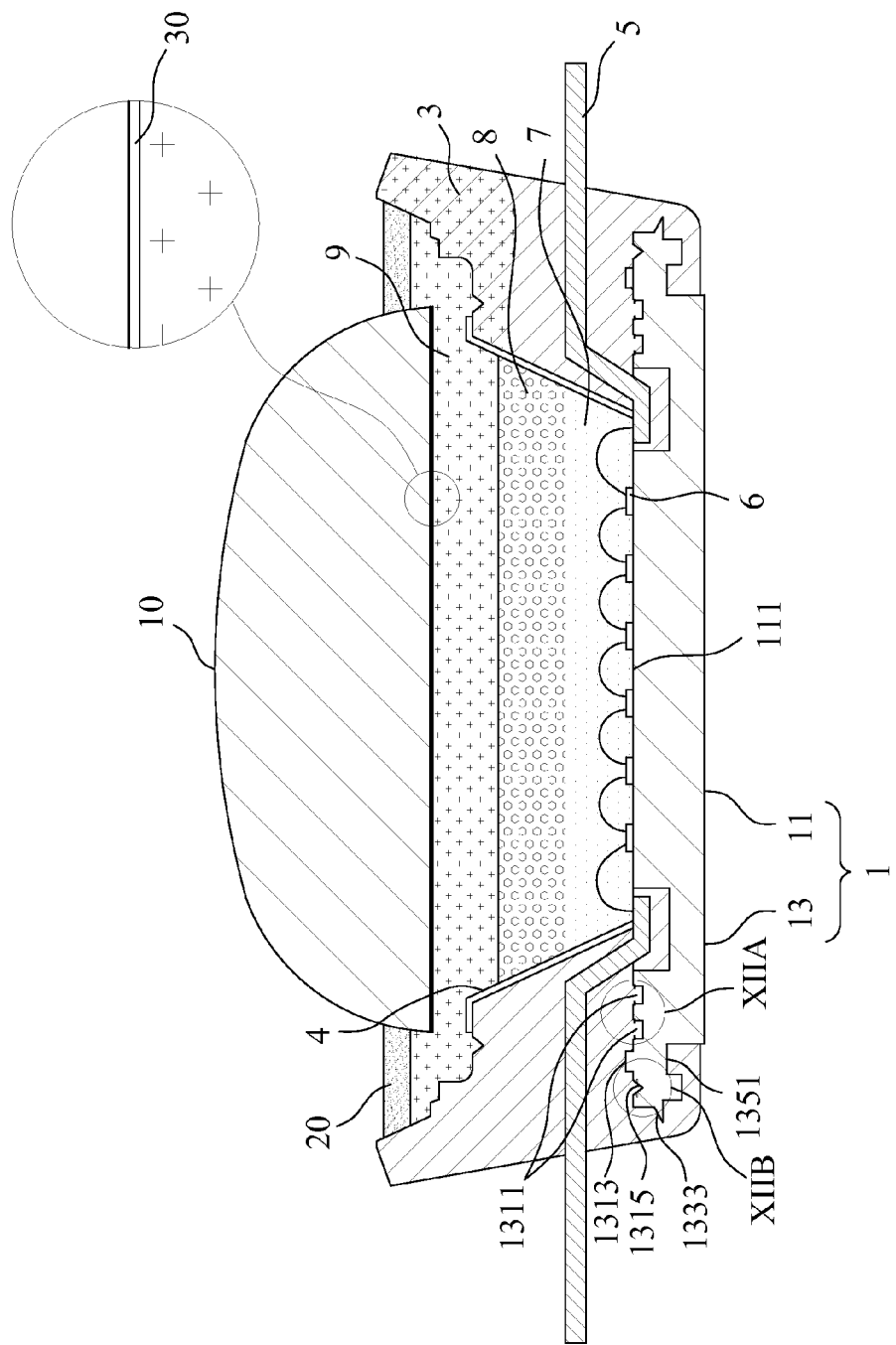
FIG. 11 is a schematic view showing the package structure of multi-layer array type LED device, according to one preferred embodiment of the present invention.

Please refer to FIG. 11, which is a schematic view showing the package structure of multi-layer array type LED device, according to one preferred embodiment of the present invention. According to this embodiment, the top surface 131 of the peripheral area 13 is provided with two first top grooves 1311, a top protrusion part 1313 and a second top groove 1315 which are sequentially arranged from inner end to outer end. The two first top grooves 1311 are both concave in shape, and the second top groove 1315 is formed in a V shape. The lateral surface 133 is formed with a lateral protrusion part 1333, wherein an L-shaped structure is defined by the lateral protrusion part 1333 and the lateral surface 133. The bottom surface 135 is formed with a bottom groove 1351.

Figure 12A:
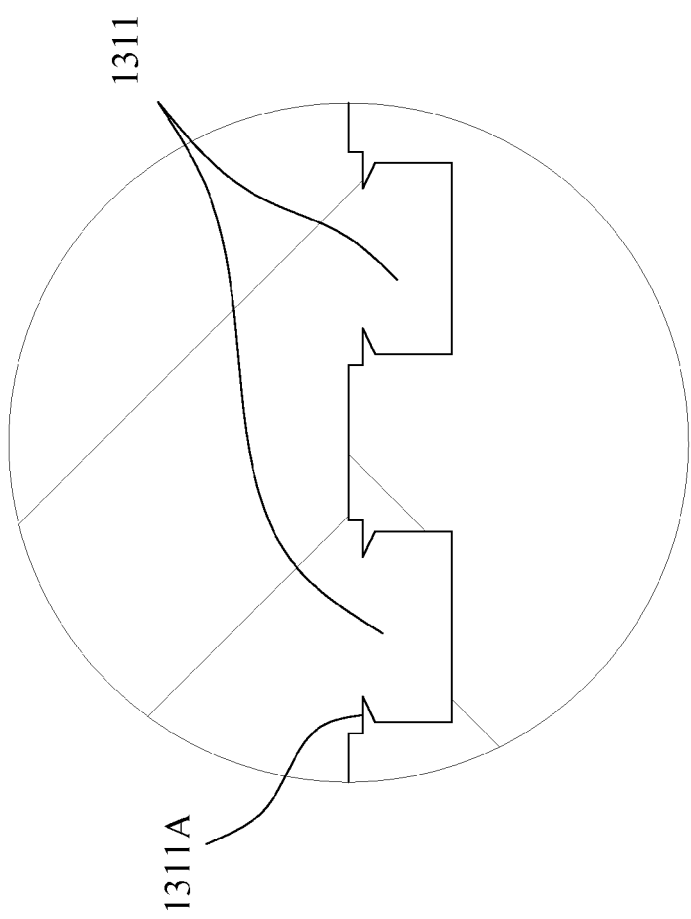
FIG. 12a is a partially enlarged view showing an area XIIA of FIG. 11.
Figure 12B:
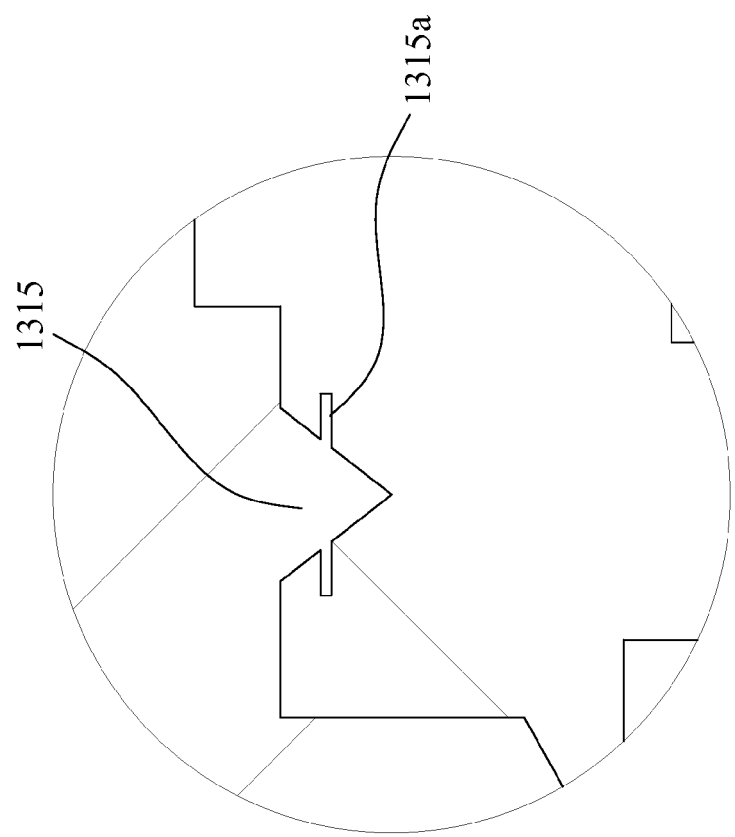
FIG. 12b is a partially enlarged view showing an area XIIB of FIG. 11.

Please refer to FIG. 12*a*, which is a partially enlarged view showing an area XIIA of FIG. 11. Please refer to FIG. 12*b*, which is a partially enlarged view showing an area XIIB of FIG. 11. The inner wall surfaces of the two top grooves 1311 can be further formed with convex flanges 1311*a*, and the inner wall surface of the second top groove 1315 can be further formed with concave flanges 1315*a*.

According to the present invention, the mentioned grooves allow a package material, which is in a liquid state, to flow and fill in the grooves. As such, when the package material is solidified, the portion of the grooves filled with the package material and the portion of the package member 3 formed by the solidified package material corresponding to the convex parts are enabled to form a latch relation with the substrate 1, so the substrate 1 and the package member 3 are firmly combined as one piece and the slide motion caused by loosening is prevented, thereby increasing the structural strength and the package sealing of the substrate and the package member.

Moreover, when the inner wall surfaces of the grooves are formed with the convex flanges 1311*a* and the concave flanges 1315*a*, the solidified package material can be respectively latched with the convex flanges 1311*a* and the concave flanges 1315*a* formed on the inner wall surfaces of the grooves, so the substrate 1 and the package member 3 are firmly combined as one piece, thereby further increasing the structural strength and the package sealing of the substrate and the package member.

What shall be addressed is that the locations of where the convex flanges 1311*a* and the concave flanges 1315*a* being actually formed are determined with respect to the actual needs. The locations disclosed in this embodiment are illustrated by way of example and not by way of limitation and the scope of the invention is defined by the appended claims which should be construed as broadly as the prior art will permit. Any of the mentioned grooves and convex parts can be installed with at least one of the convex flanges 1311*a* or the concave flanges 1315*a*, thereby enhancing the structural strength and the package sealing of the package structure provided by the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A package structure of a multi-layer array type LED device, comprising:
    a substrate, divided into a central area and a peripheral area, the top surface of the central area is defined as a light output surface, the substrate has an edge, the central area covers the central portion of the substrate, the peripheral area is defined between the central area and the edge, wherein the peripheral area has a top surface, a lateral surface and a bottom surface, and two accommodating slots are formed on the top surface;
    a package member, covering the peripheral area of the substrate but not covering the central area, the area covered by the package member including the top surface, the lateral surface and the bottom surface, the package member having a package chamber defined above the light output surface;
    two lead frames, respectively having an inner end part and an outer end part, wherein the inner end parts of the two lead frames are respectively disposed in the two accommodating slots, the portion of each lead frame defined between the inner end part and the outer end part is embedded in the package member, the inner end part and the outer end part are exposed outside the package member; and
    a plurality of LED dices, disposed on the light output surface and electrically connected to the two lead frames.

2. The package structure according to claim 1, wherein the two accommodating slots are correspondingly installed.

3. The package structure according to claim 1, wherein the package chamber has an inner wall surface, and an included angle relation is formed between the inner wall surface and the light output surface.

4. The package structure according to claim 3, wherein the inner wall surface is installed with a light reflector.

5. The package structure according to claim 1, wherein the package member utilizes a package material to cover the peripheral area of the substrate.

6. The package structure according to claim 5, wherein the package material is mold resin.

7. The package structure according to claim 6, wherein the material of mold resin is poly-phthal-amide (PPA) or liquid crystal polymer (LCP).

8. The package structure according to claim 1, wherein the two lead frames and the substrate are spaced by the package member.

9. The package structure according to claim 1, wherein the two lead frames are installed with a plurality of second cavities.

10. The package structure according to claim 9, wherein the second cavities are disposed at the peripheries of the inner end parts and the outer end parts of the two lead frames.

11. The package structure according to claim 1, wherein the LED dices are arranged on the light output surface with an array format.

12. The package structure according to claim 1, wherein the LED dices and the two lead frames form an electrical connection relation with a wire bonding means.

13. The package structure according to claim 1, wherein the LED dices are installed on the surface of the substrate through a soldering paste.

14. The package structure according to claim 13, wherein the soldering paste includes at least one of a tin paste or a silver adhesive.

15. The package structure according to claim 14, wherein the soldering paste is added with at least one of carbon crystals, diamond crystals or diamond crystals coated with nickel.

16. The package structure according to claim 1, further including a dice protection layer formed on the LED dices for covering the LED dices.

17. The package structure according to claim 16, wherein the material of the dice protection layer is silica.

18. The package structure according to claim 16, further including a fluorescent gel layer formed on the dice protection layer.

19. The package structure according to claim 18, further including a silica insulation layer formed on the fluorescent gel layer.

20. The package structure according to claim 19, further including a lens installed on the silica insulation layer.

21. The package structure according to claim 20, further including a underfilling layer, wherein the lens is adhered on the silica insulation layer by the underfilling layer.

22. The package structure according to claim 21, wherein the material of the underfilling layer is epoxy.

23. The package structure according to claim 20, wherein a binder is provided between the silica insulation layer and the lens.

24. The package structure according to claim 1, wherein the top surface is further installed with a plurality of first cavities.

25. The package structure according to claim 24, wherein the first cavities are annularly arranged.

26. The package structure according to claim 1, wherein the top surface is at least formed with a first top groove, a top protrusion part or at least one of the first top groove and the top protrusion part.

27. The package structure according to claim 26, wherein the inner wall surface of the first top groove is further formed with at least one of a convex block or a concave slot.

28. The package structure according to claim 26, wherein the outer wall surface of the top protrusion part is further formed with at least one of a convex block or a concave slot.

29. The package structure according to claim 26, wherein the shape of the first top groove is at least one of U-shaped, concave or V-shaped.

30. The package structure according to claim 26, wherein the top surface is formed with a second top groove, the top protrusion part is disposed between the first top groove and the second top groove, and the first top groove is installed close to the two accommodating slots, the second top groove is installed close to the edge of the substrate.

31. The package structure according to claim 30, wherein the inner wall surface of the second top groove is formed with at least one of a convex block or a concave slot.

32. The package structure according to claim 30, wherein the shape of the second top groove is at least one of U-shaped, concave or V-shaped.

33. The package structure according to claim 1, wherein the lateral surface is formed with at least one of at least a lateral groove or at least a lateral protrusion part.

34. The package structure according to claim 33, wherein the inner wall surface of the at least one lateral groove is further formed with at least one of a convex block or a concave slot.

35. The package structure according to claim 33, wherein the outer wall surface of the at least one lateral protrusion part is formed with at least one of a convex block or a concave slot.

36. The package structure according to claim 33, wherein the at least one lateral groove is at least one of U-shaped, concave or V-shaped.

37. The package structure according to claim 1, wherein the bottom surface is formed with at least one of at least a bottom groove or at least a bottom protrusion part.

38. The package structure according to claim 37, wherein the inner wall surface of the at least one bottom groove is formed with at least one of a convex block or a concave slot.

39. The package structure according to claim 37, wherein the outer wall surface of the at least one bottom protrusion part is formed with at least one of a convex block or a concave slot.

40. The package structure according to claim 37, wherein the at least one bottom groove is at least one of U-shaped, concave or V-shaped.

\* \* \* \* \*